United States Patent [19]
Kasha et al.

[11] Patent Number: 5,729,229
[45] Date of Patent: Mar. 17, 1998

[54] DATA INDEPENDENT LOADING OF A REFERENCE IN A SAMPLED DATA INTEGRATOR

[75] Inventors: Dan B. Kasha; Donald A. Kerth, both of Austin, Tex.

[73] Assignee: Cirrus Logic, Inc., Fremont, Calif.

[21] Appl. No.: 690,282

[22] Filed: Jul. 26, 1996

Related U.S. Application Data

[63] Continuation of Ser. No. 532,991, Sep. 25, 1995, Pat. No. 5,541,599, which is a continuation of Ser. No. 410,943, Mar. 27, 1995, abandoned, which is a continuation of Ser. No. 85,503, Jun. 30, 1993, abandoned.

[51] Int. Cl.$^6$ .................................................. H03M 3/02
[52] U.S. Cl. ................................................ 341/122; 341/143
[58] Field of Search ................................ 341/122, 143, 341/150

[56] References Cited

U.S. PATENT DOCUMENTS

| | | | |
|---|---|---|---|
| 4,622,536 | 11/1986 | Shih et al. | 341/122 |
| 4,896,156 | 1/1990 | Garverick | 341/143 |
| 5,001,725 | 3/1991 | Senderowicz et al. | 341/143 |
| 5,072,219 | 12/1991 | Boutaud et al. | 341/150 |
| 5,159,341 | 10/1992 | McCartney et al. | 341/143 |

*Primary Examiner*—Marc S. Hoff
*Attorney, Agent, or Firm*—Robert D. Lott; J. P. Violette

[57] ABSTRACT

A 1-bit discrete time digital-to-analog converter which samples a reference voltage and ground potential onto two charging capacitors during a sample phase of each sampling period, and which transfers the charge on one of the capacitors, as determined by a digital input signal, onto an integrator during a transfer phase of said sampling circuit, draws current from the reference voltages which is independent of the data into the converter. The improvement comprises the addition of at least one phase to each sampling period so that the current drawn from said reference voltage is essentially independent of said digital input signal.

4 Claims, 7 Drawing Sheets

DATA INDEPENDENT LOADING OF A REFERENCE IN A SAMPLED DATA INTEGRATOR

This is a continuation of application Ser. No. 08/532,991, filed on Sep. 25, 1995, now U.S. Pat. No. 5,541,599 which is a continuation of abandoned application Ser. No. 08/410,943, filed on Mar. 27, 1995, which is a continuation of abandoned application Ser. No. 08/085,503, now abandoned filed on Jun. 30, 1993.

TECHNICAL FIELD

This invention relates to sampled data or discrete time systems which sample a reference voltage, and more particularly, to high precision discrete time systems which sample a reference voltage such as a delta-sigma modulator.

BACKGROUND OF THE INVENTION

In delta-sigma modulators in high precision delta-sigma analog-to-digital converters an analog input signal is summed with a reference voltage at a summing node to provide an analog difference signal. The analog difference signal is integrated and quantized to produce a digital output. The digital output is also coupled to a digital-to-analog (D/A) converter which is used to select which reference level (e.g., $+V_R$ and $-V_R$) is to be applied to the summing node in the next sampling period. FIG. 1A is a schematic diagram of such a converter. The D/A can also be used in a delta-sigma digital-to-analog converter as shown in FIG. 1B. The accuracy of the A/D or D/A conversion is dependent upon the accuracy of the reference level.

In an integrated circuit delta-sigma modulator the reference voltage sources do not have zero impedance since it is impractical to produce reference voltages with virtually zero source impedance. Moreover, in some circuits an antialias network may be used to filter high frequency noise from the reference voltage. If the loading on the reference voltage is a function of the analog input signal then the delta-sigma modulator will have non-linear errors due to this signal-dependent loading of the reference voltages.

Therefore it can be appreciated that a delta-sigma modulator which provides data independent loading of a reference is highly desirable.

SUMMARY OF THE INVENTION

It is therefore an object of this invention to provide a reference voltage sampling circuit in which the loading of the voltage reference is independent of the digital output of a delta-sigma modulator. Since the digital output of a delta-sigma modulator is directly related to the analog input signal, the loading of the reference voltage will also be independent of the analog input signal.

Shown in an illustrated embodiment of the invention is a discrete time reference voltage circuit which samples a reference voltage and ground potential onto two charging capacitors respectfully during a sample phase of each sampling period, and which transfers the charge on one of the capacitors, as determined by a digital input signal, onto an integrator during a transfer phase of said sampling period. At least one phase is added to each sampling period such that the current drawn from said reference voltage is essentially independent of said digital input signal.

BRIEF DESCRIPTION OF THE DRAWINGS

The aforementioned and other features, characteristics, advantages, and the invention in general, will be better understood from the following more detailed description taking in conjunction with the accompanying drawings in which.

Figure 1A:
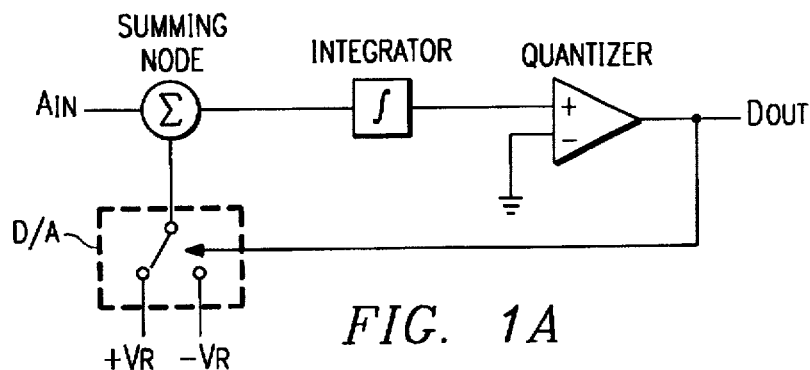
FIG. 1A is a block diagram of an A/D delta-sigma converter.
Figure 1B:
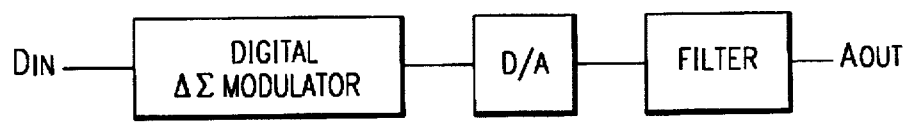
FIG. 1B is a block diagram of an D/A delta-sigma converter.

It will be appreciated that, where considered appropriate, reference numerals and letters have been repeated in the figures to indicate corresponding features.

DESCRIPTION OF THE PREFERRED EMBODIMENT

Figure 2A:
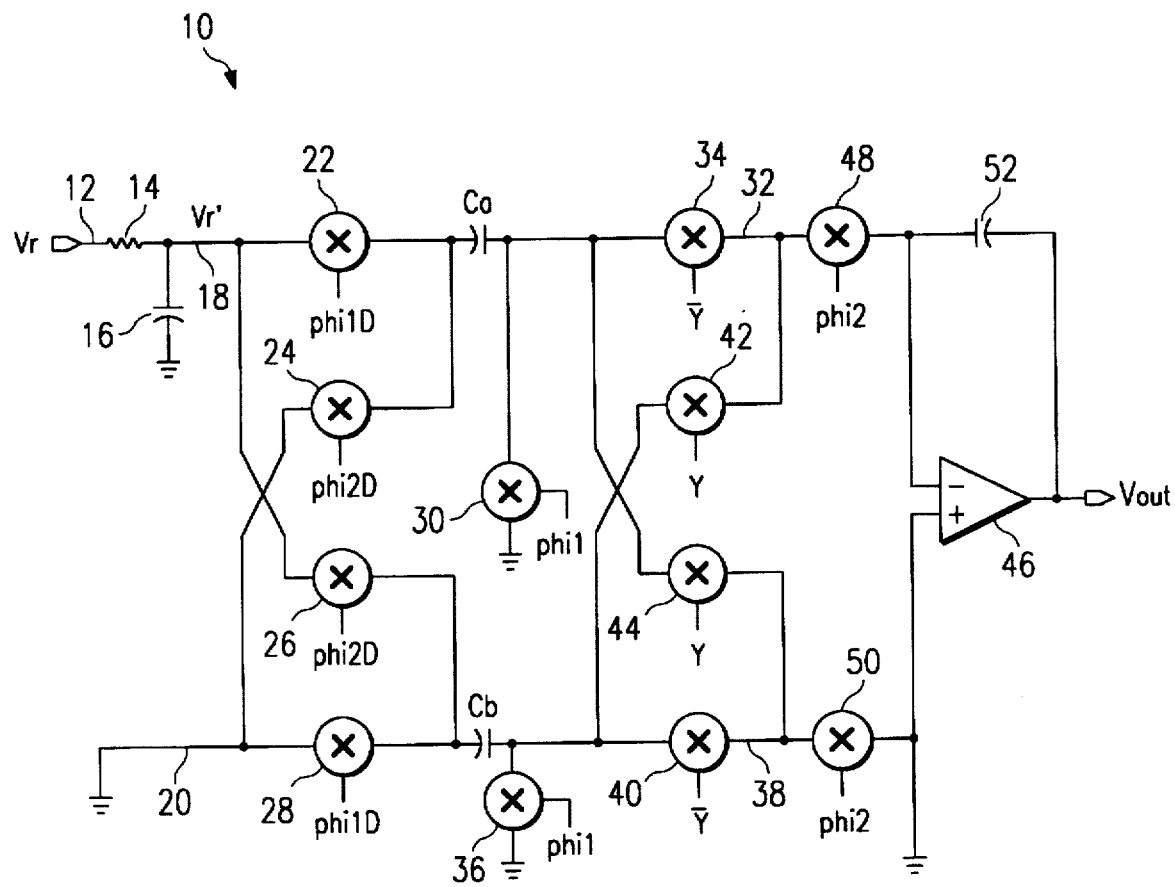
FIG. 2A is a schematic diagram of a prior art 1-bit digital-to-analog (D/A) converter.

A prior art circuit for applying one of two reference voltages, in this case Vr or ground, to a summing node in response to a digital signal, Y, corresponding to the quantized output of the delta-sigma modulator, is shown as element 10 in FIG. 2A. Since the selection of one of two reference voltages at an output terminal in response to a single digital data bit is a 1-bit digital-to-analog (D/A) converter, the circuit 10 can be said to contain a 1-bit D/A converter. Circuit 10 receives a positive reference voltage Vr at terminal 12. This positive reference voltage Vr is shown connected to one end of a series resistor 14, the other end of which is connected to an equivalent shunt capacitor 16, the resistor and capacitor having a common connection at a node 18. The signal at node 18 is shown as Vr'. The second reference voltage in FIG. 2A is ground and is shown as node 20. Node 18 is coupled to a charging capacitor Ca through a first switch 22 which is controlled by a timing signal phi1D. It will be understood that the switch 22 and the other switches shown with the same symbol in the drawings are formed with MOS transistors in a manner well known in the art.

Node 20 is also coupled to the first terminal of capacitor Ca through a switch 24 which is controlled by the timing signal phi2D. Node 18 is coupled to a first terminal of a second charging capacitor Cb through a switch 26 controlled by timing signal phi2D, and node 20 is coupled to a first terminal of the capacitor Cb through another switch 28 which is controlled by the timing signal phi1D. The second terminal of the capacitor Ca is coupled to ground through a switch 30 which is controlled by timing signal phi1 and is coupled to a node 32 through a switch 34 which is controlled by digital signal $\overline{Y}$, the logical inverse of Y. The second terminal of the capacitor Cb is coupled to ground through a switch 36 which is controlled timing signal phi1. The second terminal of the capacitor Cb is coupled to a node 38 through a switch 40 which is also controlled by digital signal $\overline{Y}$. The second node of the capacitor Cb is coupled to node 32 through a switch 42 which is controlled by the digital signal Y. Similarly, the second terminal of capacitor Ca is coupled to node 38 through a switch 44 which is controlled by digital signal Y. Node 32 is coupled to the inverting input of an operational amplifier 46 through a switch 48 which is controlled by the timing signal phi2. Node 38 is coupled to the noninverting input of operational amplifier 46 through a switch 50 which is controlled by a timing signal phi2. The noninverting input of the amplifier 46 is also connected to ground. The output of the operational amplifier 46 forms Vout which is coupled back to the inverting input of the amplifier 46 through a feedback capacitor 52. (In the preferred embodiment, the inverting input of the operational amplifier 46 also serves as the summing node of the delta-sigma modulator, with the sampled analog input signal also coupled to the node, and the output Vout forming the difference signal which is integrated.) The timing signal for the circuit of FIG. 2A is shown in FIG. 2B.

Vr is a constant reference voltage that is used to charge capacitors Ca and Cb. According to the value of the data (Y=1 or $\overline{Y}$=1), charge is transferred to the feedback capacitor 52 producing the required change in the output voltage Vout. The antialias network shown may be needed to filter high frequency noise from the reference voltage, and may also include parasitic resistance in the path to the reference.

The resistance of the antialias network is a potential source of distortion if the current drawn from the antialias network is data dependent. Circuit 10 is designed to have a constant current flowing from the reference voltage Vr' which is independent of the data signal Y and $\overline{Y}$.

Figure 2B:
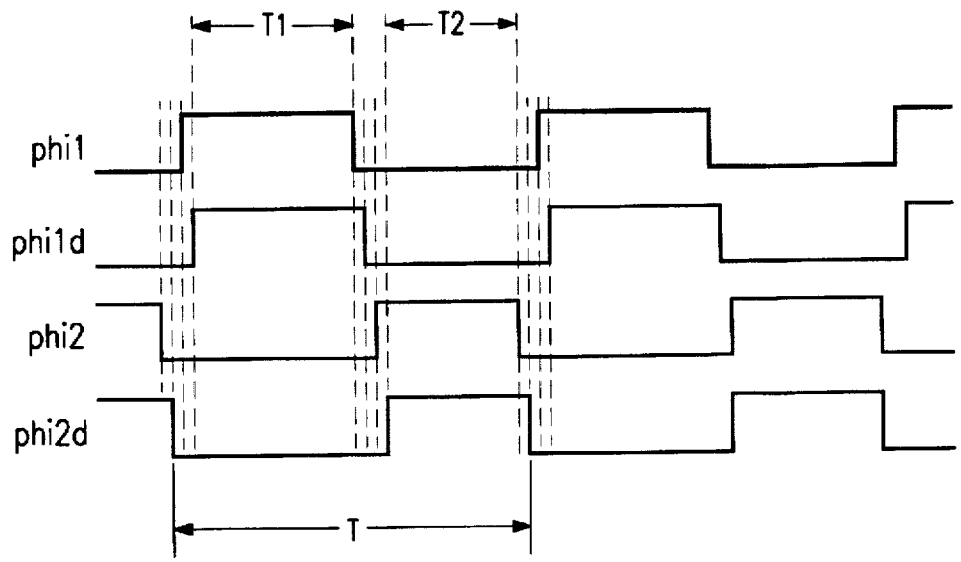
FIG. 2B is a timing diagram for the 1-bit D/A converter of FIG. 2A.

With reference now to FIG. 2B, during time interval T1 the capacitor Ca is charged to Vr' and the capacitor Cb is discharged. During time interval T2 the first terminal of the capacitor Ca is coupled to ground and the first terminal of capacitor Cb is coupled to Vr'. The second terminals of the capacitors Ca and Cb are coupled to ground either directly or through the virtual ground of the inverting input of the operational amplifier 46 depending on the data signal Y. Therefore, to a first order approximation, the charge drawn from Vr' is the same no matter what the state of the data signal, Y.

However this first order approximation of the charge drawn from the reference voltage Vr does not take into account realistic circuit imperfections in the operational amplifier 46.

Figure 2C:
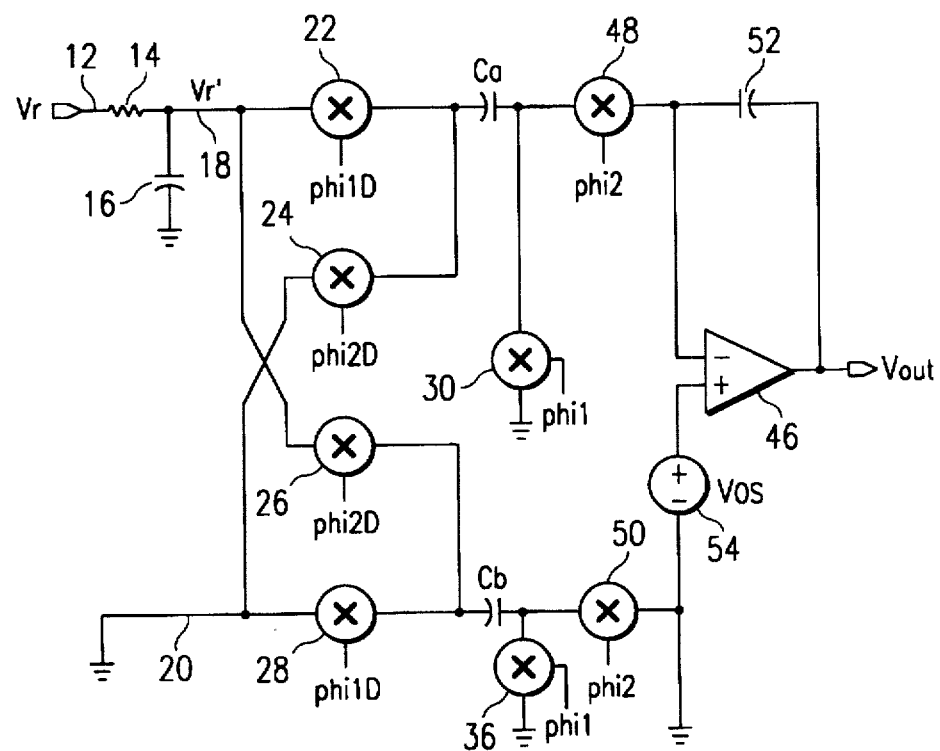
FIG. 2C is a schematic diagram of the 1-bit D/A converter of FIG. 2A in which the digital input signal Y=0.
Figure 2D:
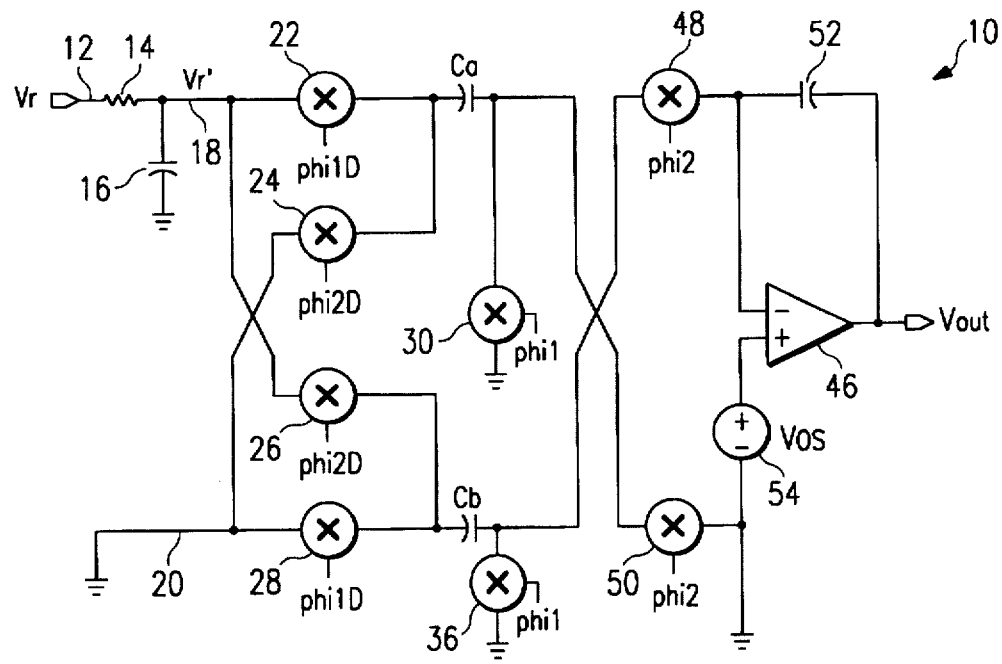
FIG. 2D is a schematic diagram of the 1-bit D/A converter of FIG. 2A in which the digital input signal Y=1.

FIGS. 2C and 2D show the circuit of FIG. 2A for the two cases where $\overline{Y}$=1 and Y=1 respectively, with the Y and $\overline{Y}$ switches removed for clarity. In addition, the offset voltage 54 of the operational amplifier 46, also shown as Vos, has been added. This circuit imperfection will result in a data dependent charge being drawn from the reference Vr.

Turning now to FIG. 2C, consider the case with $\overline{Y}$=1. The charge drawn from Vr' when $\overline{Y}$=1 is:

| Time Interval | Charge from Vr' |
| --- | --- |
| T1 | Ca(Vr' + Vos) |
| T2 | Cb.Vr' |
| Sum (T1→T2) | Vr'(Ca + Cb) + Vos.Ca |

The Ca·Vos term in time interval T1 results from the previous sampling period ($\overline{Y}$ also =1) when the capacitor Ca, during time interval T2, has ground on its first terminal and Vos on its second terminal.

However, the charge drawn from Vr' when Y=1 (FIG. 2D) is:

| Time Interval | Charge from Vr' |
| --- | --- |
| T1 | Ca.Vr' |
| T2 | Cb(Vr' − Vos) |
| Sum (T1→T2) | Vr'(Ca + Cb) − Vos.Cb |

Therefore the total difference or error between the Y=1 and $\overline{Y}$=1 cycles is Vos(Ca+Cb).

Figure 3A:
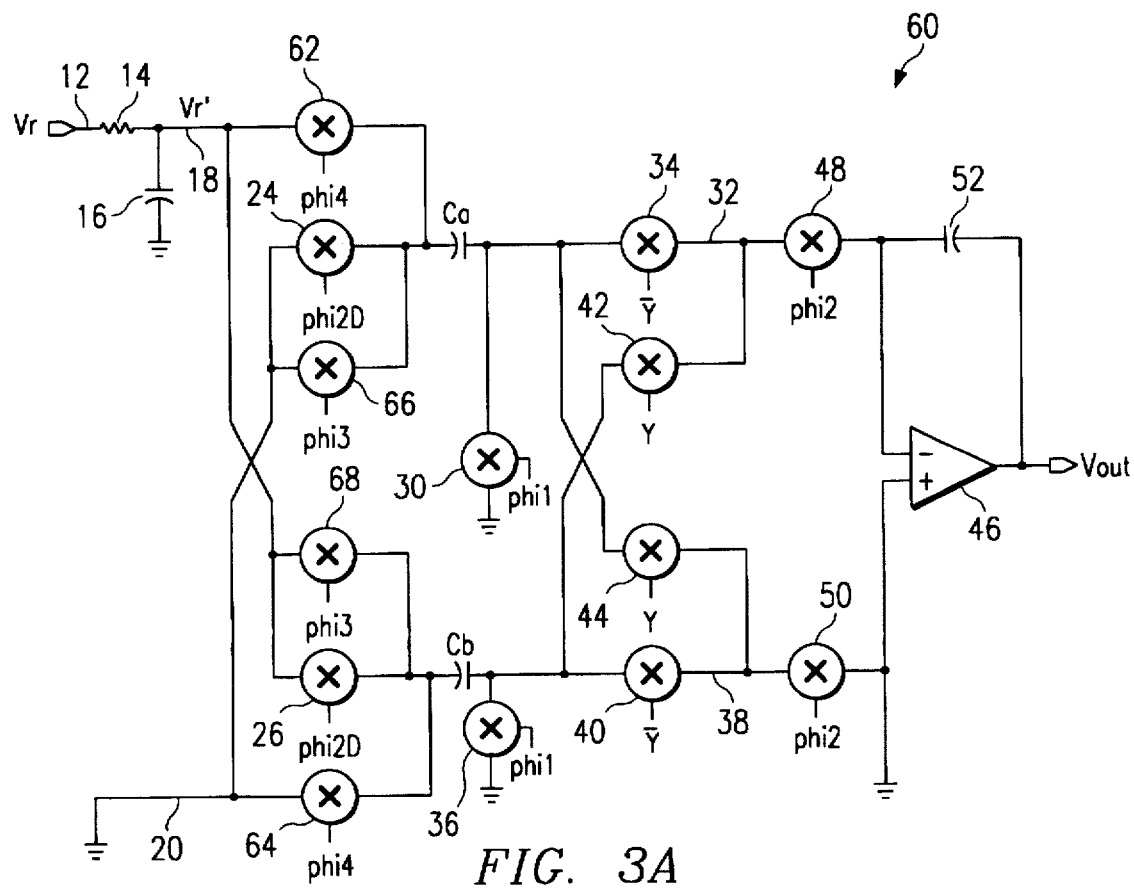
FIG. 3A is a 1-bit D/A converter with a distortion reduction circuit according to the present invention.
Figure 3B:
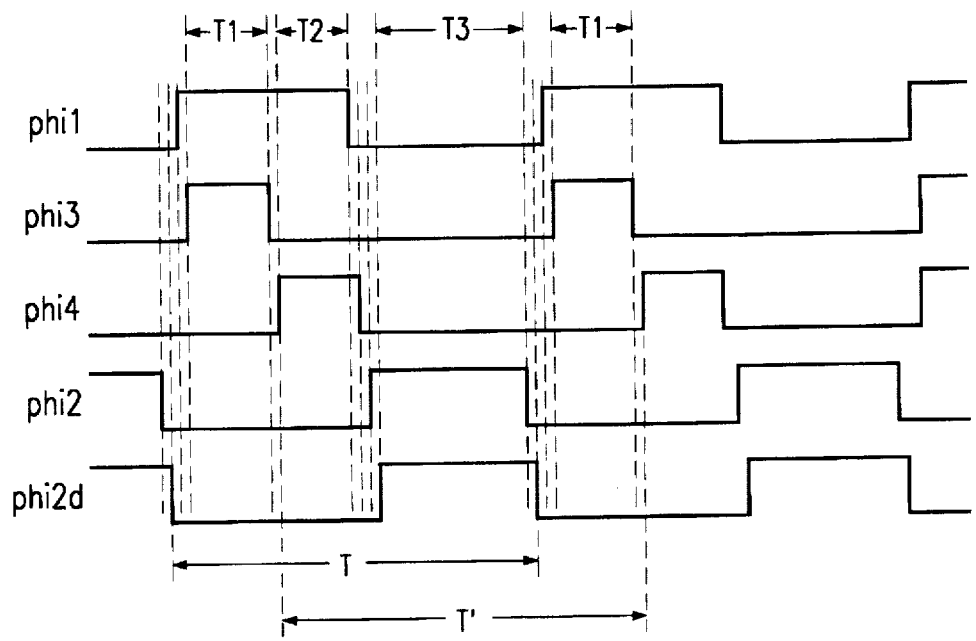
FIG. 3B is a timing diagram for the 1-bit D/A converter of FIG. 3A.

A circuit 60 which eliminates this error voltage is shown in FIG. 3A. The timing for this circuit is shown in FIG. 3B. The switches 22 and 28 of FIG. 2A have been replaced by switches 62 and 64 respectively. Switches 62 and 64 are controlled by the timing signal phi4. Also additional switches 66 and 68 have been connected in parallel with switches 24 and 26 respectively. Switches 66 and 68 are controlled by timing signal phi3. The phi1D phase from the circuit 10 has been replaced with a combination of a phi3 phase and a phi4 phase. The timing diagram shown in FIG. 3B indicates that there are basically three phases to the total cycle—that is when phi3 is high, when phi 4 is high, and when phi2 is high. The on time for each phase must be at least the time needed to accurately settle the voltage in each phase, although the timing shown in FIG. 3B represents not the minimum timing required but rather results from a compromise with other timing requirements of the integrated circuit.

The sampling period is a time frame which includes each of three phases T1, T2, and T3. Thus the sampling period T in FIG. 3B is shown as the sequence of phases T1, T2, and T3. Alternatively, the sampling period T' is shown as the sequence of phases T2, T3, and T1. In the following discussion the sequence of T' (T2, T3, T1) will be used, although it will be understood by those skilled in the art that the analysis results are the same if the sequence of T (T1, T2, T3) is used.

A comparison of FIGS. 2B and 3B will show that the phase T1 in FIG. 3B can be considered as an additional phase. When the sampling period is T in FIG. 3B, the additional phase can be considered as an additional phase in the sample period (T1 and T2), while the transfer period is T3. When the sampling period is T' in FIG. 3B, the additional phase (T1) can be considered as a phase in addition to the sample period (T2), and the transfer period (T3).

As will be shown, the function of the phi2 (and phi2D) phase has not been changed from the previous circuit, and the phi4 phase performs the same function as previous phi1D phase with respect to coupling reference voltages to the first terminals of the capacitor Ca and Cb. The phi3 phase is added to assure that the capacitors are fully charged (Cb case) or fully discharged (Ca case) before the next cycle. The charge from Vr will now be Vr'(Ca+Cb) in each cycle, independent of the data and Vos.

FIGS. 2C and 2D will be used to analyze this circuit in the presence of Vos for the $\overline{Y}$=1 and Y=1 case respectively.

Figure 3C:
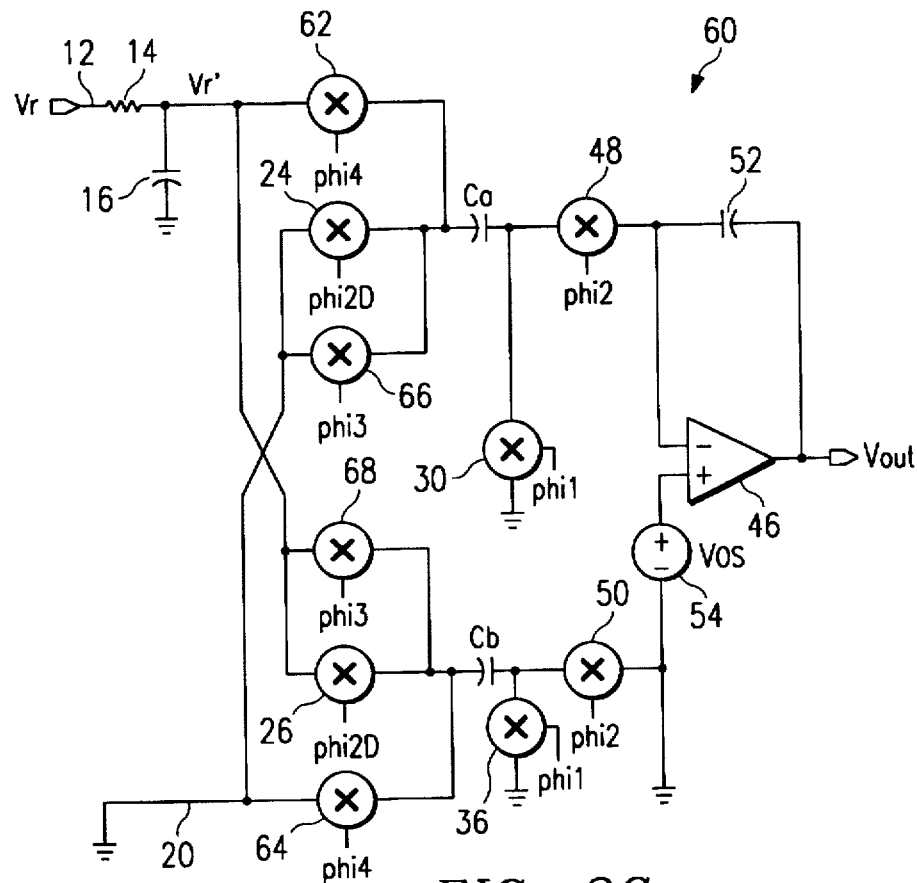
FIG. 3C is a schematic diagram of the 1-bit D/A converter of FIG. 3A in which the digital input signal Y=0.

Turning now to FIG. 3C and the case where $\overline{Y}=1$, the charge drawn from Vr' when $\overline{Y}=1$ is:

| Time Interval | Charge from Vr' |
| --- | --- |
| T2 | Ca.Vr' |
| T3 | Cb.Vr' |
| T1 | 0 |
| Sum (T1→T3) | Vr'(Ca + Cb) |

Figure 3D:
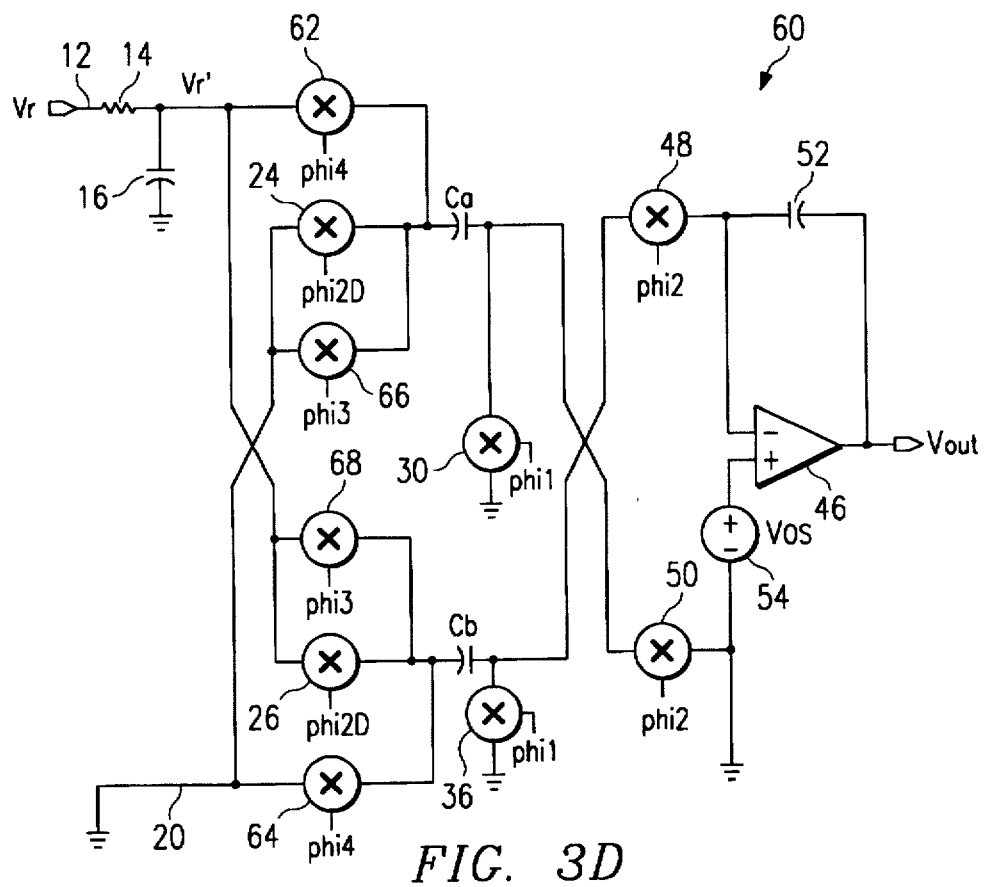
FIG. 3D is a schematic diagram of the D/A converter of FIG. 3A in which the digital input signal Y=1.

With reference now to FIG. 3D, the charge drawn from Vr' when Y=1 is:

| Time Interval | Charge from Vr' |
| --- | --- |
| T2 | Ca.Vr' |
| T3 | Cb(Vr' − Vos) |
| T1 | Cb.Vos |
| Sum (T1→T3) | Vr'(Ca + Cb) |

As can be seen the charge drawn from Vr' is the same for both $\overline{Y}=1$ and Y=1. The circuit 60 therefore produces no data dependent voltage drop across the input resistor 14.

Figure 4A:
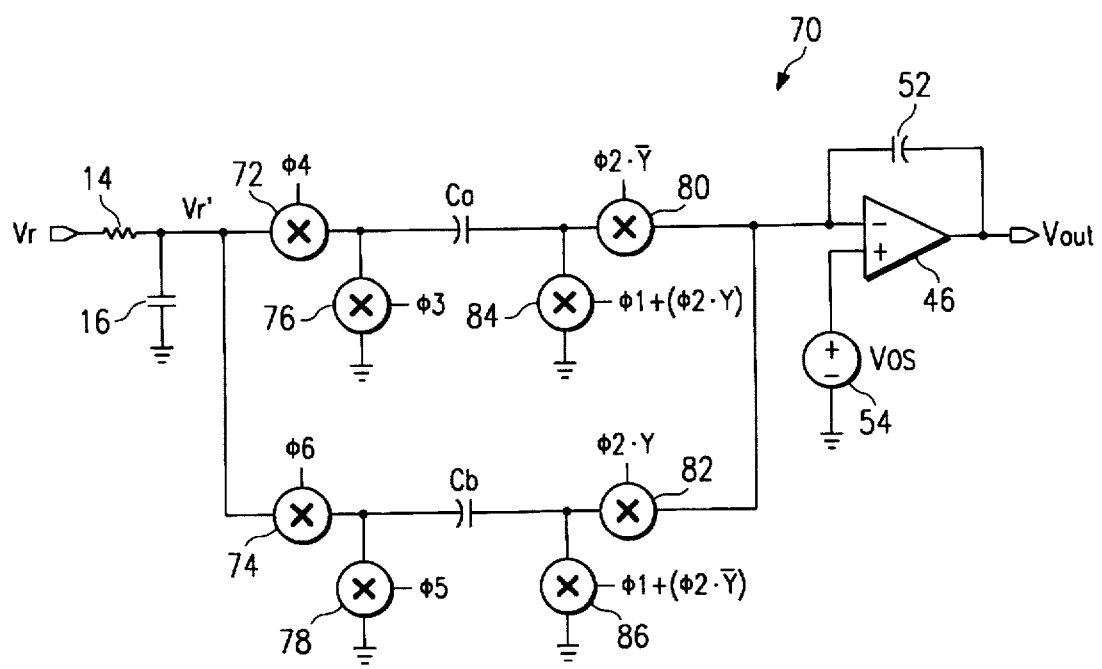
FIG. 4A is a schematic diagram of an alternative embodiment of a 1-bit D/A converter with a distortion reduction circuit according to the present invention.

FIG. 4A is a schematic diagram 70 of an alternative embodiment of the present invention. The signal Vr' is coupled to the first terminal of the capacitor Ca through a switch 72 controlled by timing signal phi4, and to the first terminal of the capacitor Cb through a switch 74 controlled by timing signal phi6. The first terminal of the capacitor Ca is coupled to ground through a switch 76 controlled by timing signal phi3, and the first terminal of the capacitor Cb is coupled to ground through a switch 78 controlled by timing signal phi5.

The second terminal of the capacitor Ca is coupled to the inverting input of the operational amplifier 46 through a switch 80 controlled by timing signal (phi2 and $\overline{Y}$), and the second terminal of the capacitor Cb is coupled to the inverting input of the operational amplifier 46 through a switch 82 controlled by timing signal (phi2 and Y). The second terminal of the capacitor Ca is coupled to ground through a switch 84 controlled by timing signal (phi1 or (phi2 and Y)), and the second terminal of the capacitor Cb is coupled to ground through a switch 86 controlled by timing signal (phi1 or (phi2 and $\overline{Y}$)). The noninverting input of the operational amplifier 46 is coupled to ground with the offset voltage, Vos, shown between the noninverting input and ground.

Figure 4B:
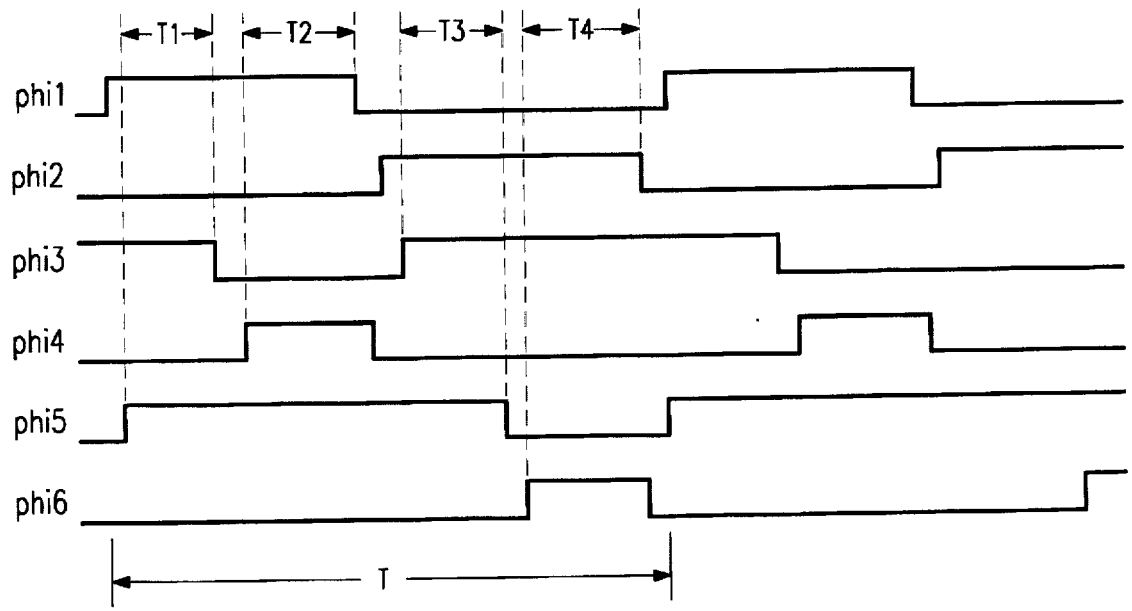
FIG. 4B is a timing diagram for the 1-bit D/A converter of FIG. 4A.

FIG. 4B is a timing diagram for FIG. 4A. These two figures will be used to analyze this circuit in the presence of Vos for the Y=1 case and the $\overline{Y}=1$ case, respectively.

The charge drawn from Vr' when Y=1 is:

| Time Interval | Charge from Vr' |
| --- | --- |
| T1 | 0 |
| T2 | Ca.Vr' |
| T3 | 0 |
| T4 | Cb.Vr' |
| Sum (T1→T4) | Vr'(Ca + Cb) |

The capacitor Cb is charged to Vos during T3, but the charge is pulled from ground and not Vr'.

The charge drawn from Vr' when $\overline{Y}=1$ is:

| Time Interval | Charge from Vr' |
| --- | --- |
| T1 | 0 |
| T2 | Ca.Vr' |
| T3 | 0 |
| T4 | Cb.Vr' |
| Sum (T1→T4) | Vr'(Ca + Cb) |

Therefore the charge drawn from Vr' when Y=1 is the same as when $\overline{Y}=1$.

Figure 5A:
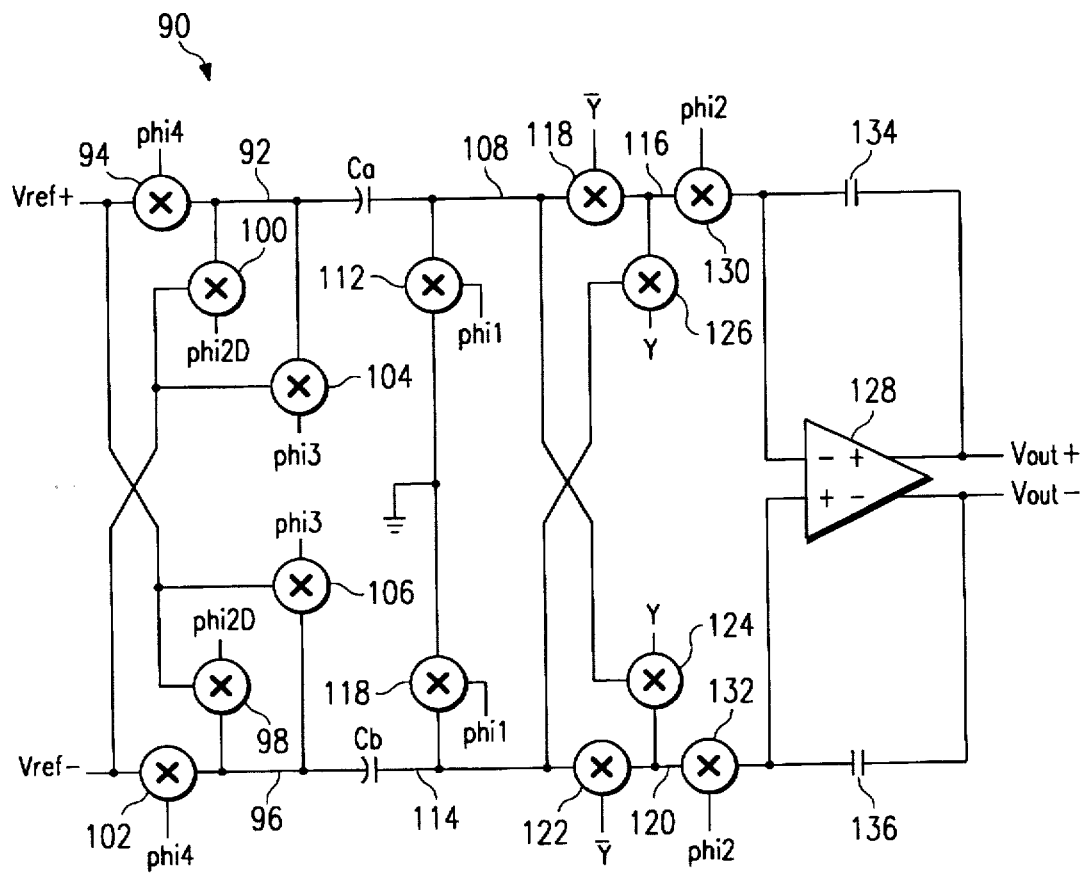
FIG. 5A is a schematic diagram of an alternative embodiment of a 1-bit D/A converter according to the present invention.

FIG. 5A is a schematic diagram of a fully differential 1-bit D/A converter 90. As shown in FIG. 5A, a positive reference voltage, Vref+, is coupled to a first node 92 through a switch 94 controlled by timing signal phi4, and is coupled to another node 96 through two switches in parallel, a first switch 98 controlled by timing signal phi2D, and a second switch 106 controlled by timing signal phi3. A negative reference voltage, Vref−, is coupled to the node 92 through two switches in parallel, a first switch 100 controlled by timing signal phi2D, and a second switch 104 controlled by timing signal phi3. Vref− is also coupled to the node 96 through another switch 102 controlled by timing signal phi4. Node 92 is connected to one terminal of the capacitor Ca, and node 96 is connected to one terminal of the capacitor Cb.

The second terminal of the capacitor Ca is connected to a node 108 which is coupled to ground through a switch controlled by timing signal phi1. The second terminal of the capacitor Cb is connected to a node 114 which is coupled to ground through a switch 118 controlled by timing signal phi1. The node 108 is coupled to another node 116 through a switch 118 controlled by data signal Y, and the node 114 is coupled to another node 120 through a switch 122 controlled by data signal $\overline{Y}$. The node 108 is coupled to the node 120 through a switch 124 controlled by data signal Y. Similarly the node 114 is coupled to the node 116 through a switch 126 controlled by data signal Y. The node 116 is coupled to the inverting input of a fully differential operational amplifier 128 through a switch 130 controlled by timing signal phi2, and the node 120 is coupled to the noninverting input of the operational amplifier 128 through a switch 132 controlled by timing signal phi2. The positive output of the operational amplifier 128 forms the Vout+ signal, and is couple to the inverting input of the operational amplifier 128 through a feedback capacitor 134. The negative output of the operational amplifier 128 forms the Vout− signal, and is couple to the noninverting input of the operational amplifier 128 through a feedback capacitor 136.

It will be understood that, in order to minimize clutter, the antialias networks connected to the Vref+ and Vref− inputs has not been shown in the figure.

The timing diagram for the circuit of FIG. 5A is the same as the timing diagram shown in FIG. 3B since the circuit of FIG. 5A operates in virtually the same manner as the circuit of FIG. 3A. As described above with respect to FIG. 3B, the sampling period is divided into three phases T1, T2, and T3. T2 is the sample phase, T3 is the transfer phase, and T1 is the added phase which causes the loading on the reference voltages, Vref1 and Vref2, to be independent of the data signals Y and $\overline{Y}$.

Figure 5B:
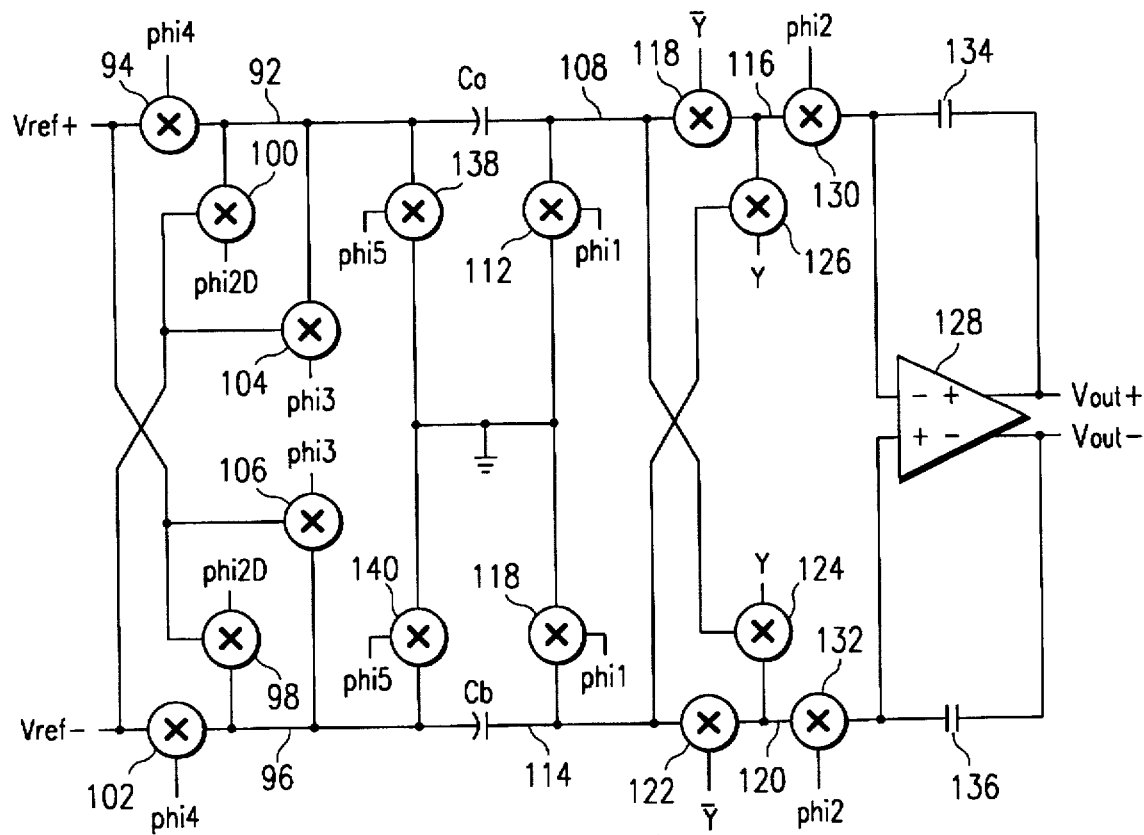
FIG. 5B is a schematic diagram of an alternative embodiment of a 1-bit D/A converter of FIG. 5A which incorporates detent switching.

The circuit of FIG. 5A may be modified to avoid hot current effects in the transistors used to realize switches 118, 122, 124, 126, 130, and 132 by introducing detent switching of the reference voltages onto the capacitors Ca and Cb as shown in FIG. 5B. As shown in FIG. 5B two additional switches have been added. A switch 138 couples node 92 to ground, and a switch 140 couples node 96 to ground.

Figure 5C:
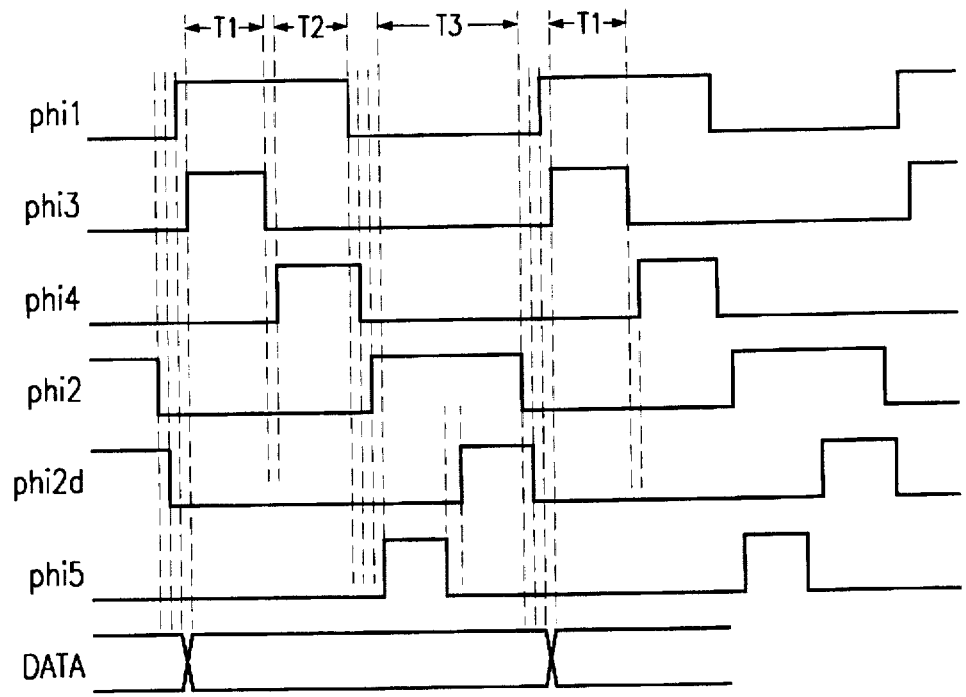
FIG. 5C is a timing diagram for the 1-bit D/A converter of FIG. 5B.

With reference now to FIG. 5C the operation of the additional switches 138 and 140 is to provide a middle charge voltage (in this case a voltage, ground, half way between Vref+ and Vref−) to the capacitors Ca and Cb when the reference voltages being applied to the first terminals of the capacitors Ca and Cb is switched. The additional switches cause the voltage change to occur in two steps rather than one so that the current through the switches 118, 122, 124, 126, 130 and 132 is decreased during each transition. This decrease in current may avoid any hot electron effects which would otherwise arise in the transistors of these switches.

The above discussion has not mentioned the effects of charge injection of the switching transistors, for example transistors 30, 36, 48 and 50 of FIG. 2A. Those skilled in the art will recognize that some of these charge injections cancel each other out, but not all of the charge injection mismatches are canceled out. The charge injection mismatches which are not canceled out will produce an error which is very much like the error caused by the offset voltage 54 of the operational amplifier 46. The present invention also negates this charge injection mismatch error in so far as it affects the data dependent charge pulled from the reference voltage.

Conventional autozero schemes well known in the art would possibly eliminate Vos, and hence eliminate data dependent loading errors. However, such schemes do not adequately compensate charge injection mismatch errors from the reference path switches.

Although the invention has been described in part by making detailed reference to a certain specific embodiment, such detail is intended to be, and will be understood to be, instructional rather than restrictive. It will be appreciated by those skilled in the art that many variations may be made in the structure and mode of operation without departing from the spirit and scope of the invention as disclosed in the teachings contained herein.

What is claimed is:

1. A fully differential discrete time circuit which samples a first reference voltage and a second reference voltage onto two charging capacitors respectively during a sample phase of each sampling period, and which transfers the charge on both of the capacitors onto an integrator during a transfer phase of said discrete time circuit, the improvement comprising timing the sample and transfer of said reference voltages to said integrator such that the charge on both of said charging capacitors will be essentially zero at the beginning of said sample period.

2. A fully differential discrete time reference voltage circuit which samples a first reference voltage and a second reference voltage onto two charging capacitors respectively during a sample phase of each sampling period, and which transfers the charge on both of the capacitors onto an integrator during a transfer phase, wherein at least one of said sample or transfer phase is comprised of at least two states, each of said at least two states having a unique combination of switch positions, wherein a portion of said switch positions in at least one of said two states is controlled by a digital input signal to said reference voltage circuit, the improvement comprising the addition of at least one additional state to each sampling period such that any difference in loading of said first reference voltage and said second reference voltage for differing said digital input signals to said discrete time reference voltage circuit is substantially compensated for during said additional state such that the current drawn from said first reference voltage and said second reference voltage is essentially independent of said digital input signal.

3. A fully differential discrete time reference voltage circuit which samples a first reference voltage and a second reference voltage onto two charging capacitors respectively during a sample phase of a sampling period, and which transfers the charge on both of the capacitors onto an integrator during a transfer phase, wherein at least one of said sample or transfer phase is comprised of at least two states having differing connections of a plurality of switches in said voltage reference circuit, wherein a portion of said plurality of switches in at least one of said two states is controlled by a digital input signal to said reference voltage circuit, the improvement comprising the addition of at least one additional state to each sampling period such that any difference in loading of said first reference voltage and said second reference voltage for differing said digital input signals to said discrete time reference voltage circuit is substantially compensated for during said additional state such that the current drawn from said first reference voltage and said second reference voltage is essentially independent of said digital input signal.

4. A fully differential discrete time reference voltage circuit which samples a first reference voltage and a second reference voltage onto two charging capacitors respectively during a sample phase of each sampling period, and which transfers the charge on both of the capacitors onto an integrator during a transfer phase of said discrete time reference voltage circuit, the improvement comprising the addition of at least one additional time period to each sampling period such that any difference in loading of said first reference voltage and said second reference voltage to for differing digital input signals to said discrete time reference voltage circuit is substantially compensated for during said additional time period such that the current drawn from said first reference voltage and said second reference voltage is essentially independent of said digital input signal.

* * * * *